United States Patent [19] [11] 3,840,822
Hoffmann [45] Oct. 8, 1974

[54] DECADICALLY ADJUSTABLE FREQUENCY SYNTHESIZER

[75] Inventor: Gunther Hoffmann, Eningen, Germany

[73] Assignee: Wandel U. Goltermann, Reutlingen, Germany

[22] Filed: Aug. 16, 1973

[21] Appl. No.: 388,886

[30] Foreign Application Priority Data
Aug. 16, 1972 Germany........................... 2240216

[52] U.S. Cl......................... 331/16, 331/17, 331/18
[51] Int. Cl............................................. H03b 3/04
[58] Field of Search.......................... 331/16, 18, 11

[56] References Cited
UNITED STATES PATENTS
3,441,870 4/1969 Wicker ................................ 331/11
3,441,871 4/1969 Wicker ................................ 331/11

*Primary Examiner*—John Kominski
*Attorney, Agent, or Firm*—Karl F. Ross; Herbert Dubno

[57] ABSTRACT

A variable-frequency oscillator works through a pulse shaper, a pulse-rate modifier and a frequency divider of step-down ratio $n$: 1 into a phase comparator also receiving the output of a generator of reference frequency $f$. To adjust the operating frequency F of the oscillator at a selected value $F = nf \pm k$, a pulse train of repetition frequency or cadence $k$ is fed to the pulse-rate modifier to reduce or augment the number of pulses per second reaching the divider. The modifying pulse train may be derived from one or more stages of the frequency divider, from a step-down network driving the reference-frequency generator, an independent pulse source.

15 Claims, 11 Drawing Figures

DECADICALLY ADJUSTABLE FREQUENCY SYNTHESIZER

FIELD OF THE INVENTION

My present invention relates to an adjustable frequency synthesizer in which a variable-frequency oscillator is controlled, through the intermediary of a phase comparator, by a generator of constant reference frequency whose output is continuously matched with that of a frequency divider driven by the oscillator.

BACKGROUND OF THE INVENTION

Such a system is known, for example, from U.S. Pat. No. 3,441,870 which also discloses the provision of an interpolation circuit serving to vary the step-down factor of the divider in order to establish oscillator frequencies which are not exact multiples of the reference frequency. This interpolation circuit increases the count of the lowest-ranking divider stage by one unit per cycle over as many cycles as is necessary to produce the desired frequency variation, within a range not exceeding the magnitude of the reference frequency.

OBJECTS OF THE INVENTION

The general object of my present invention is to provide a frequency synthesizer of this class which is of relatively simple construction and has a wide range of adjustability.

A more particular object is to provide a synthesizer using a divider of fixed step-down rate $n$:1 in combination with means enabling the oscillator frequency F to be adjusted to values either higher or lower than the product $nf$ where $f$ is the constant reference frequency.

SUMMARY OF THE INVENTION

I realize these objects, in accordance with my present invention, by means of the pulse-rate modifier inserted between the output of the variable-frequency oscillator and the associated frequency divider, this modifier receiving on a control input a pulse train of repetition frequency or cadence $k$; the output of the oscillator is delivered to the modifier in the form of a succession of sharp spikes generated directly by the oscillator or in a pulse shaper connected thereto.

The arrival of a pulse at the control input diminishes or augments the number of discrete spikes entering the frequency divider in a given unit of time; in the first case the pulse causes the suppression of at least one spike (generally the next-following spike) in the modifier output, whereas in the second case at least one separate spike is added. Thus, the frequency divider receives the spikes of the oscillator with a mean repetition frequency $F' = F \pm mk$ ($m$ being the number of spikes subtracted or added for each control pulse) corresponding to a mean output frequency $F'/n$ fed to the phase comparator; during steady-state operation, in which this mean output frequency $F'/n$ is to equal the reference frequency $f$ also applied to the phase comparator, the relationship between frequencies F and $f$ is therefore given by $F = nf \pm mk$, with the parameter $k$ freely selectable. In the preferred case specifically described hereinafter, $m = 1$.

The source of control pulses may be an independent pulse generator, in which case these pulses generally will not be harmonically related to either the oscillator frequency F or the reference frequency $f<F$. Advantageously, however, these pulses are extracted from a preferably decadic stage of the frequency divider in the output of the oscillator or from a similar divider stage in the input of the reference-frequency generator. Such a divider stage may drive, in series or in parallel, a plurality of cascaded decadic step-down stages within the source itself; alternatively, or in addition, one or more supplemental pulse-rate modifiers may be interspersed with some of the stages of the main frequency divider in the output of the first-mentioned modifier. In order to establish a desired sequence of control pulses, individual digital selectors may be connected to the inputs or outputs of the several decadic stages and/or to the control inputs of the several pulse-rate modifiers.

If the number of control pulses per measuring period (i.e., per operating cycle of the reference-frequency generator) is invariant for a selected oscillator setting, which will be the case whenever the recurrence rate of individual pulses or pulse groups in the central train is equal to or a multiple of reference frequency $f$, the output of the phase comparator will be constant. With irregular or subharmonic control pulses, however, a phase jump will occur from time to time so that the oscillator frequency F would be subjected to fluctuation if the frequency-determining element (e.g. a varactor) of the oscillator were directly energized by the comparator output. In order to avoid these fluctuations, a low-pass filter may be inserted between the comparator and the frequency-control circuit of the oscillator. Since the presence of such a filter delays the attainment of steady-state operation, I prefer to provide the filter with a variable time constant which is low in the presence of a large variation in input voltage (thus allowing rapid coarse tuning) and high in the presence of minor voltage changes (i.e., during fine tuning). This can be accomplished, pursuant to a further feature of my invention, by designing the filter as an RC network whose series resistance includes a fixed resistor shunted by a pair of antiparallel diodes whose forward threshold determines the point of sharp change of the time constant of the network. Higher thresholds, if desired, could be obtained by the cascading of several diodes.

For small frequency increments ($\Delta F < f$) the number of control pulses per measuring period cannot remain constant. Thus, another feature of my invention resides in the provision of special circuitry for supplying to the phase comparator a compensating electrical quantity (voltage or current) designed to minimize the change in the output voltage of this comparator due to control pulses (or pulse groups) of low recurrence rate. I accomplish this, in a system in which the control pulses are derived from a chain of decadic step-down stages under the control of respective digital selectors, by transmitting the setting of at least the lowest-order selector or selectors to a digital analog converter whose output modifies the base level of a sawtooth-wave generator in the phase comparator according to this setting. Since, however, the relative significance of a unit change of m spikes in the output of the oscillator is inversly proportional to the frequency F, the output of the digital analog converter is modified by a weighting signal directly proportional to 1/F, i.e., to the operating period of the oscillator.

In a preferred embodiment of my invention, in which the pulse-rate modifier or modifiers operate subtractively by suppressing a spike in the oscillator output for each incoming control pulse, I utilize a modifier comprising bistable pulse-storing means such as a pair of interconnected flip-flops connected to be set by a control pulse and to be reset by the next spike; a coincidence circuit, such as an AND gate, has inputs connected to both the oscillator output and the pulse-storing means in order to give passage to a spike only during an oscillator cycle in which no control pulse is received.

BRIEF DESCRIPTION OF THE DRAWING

The above and other features of my invention will be described in detail hereinafter with reference to the accompanying drawing in which.

SPECIFIC DESCRIPTION

Figure 1:
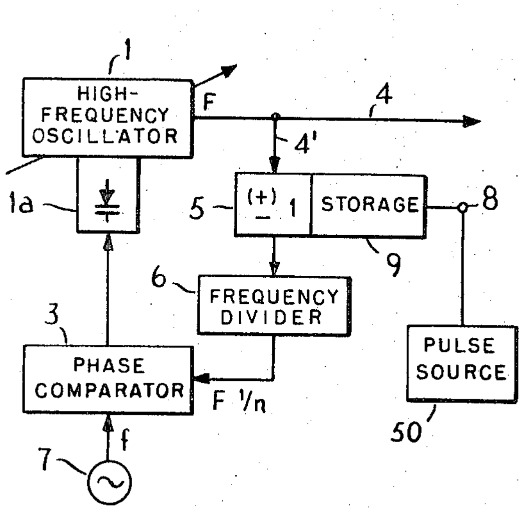
FIG. 1 is a simplified block diagram of a frequency synthesizer embodying my invention.

In FIG. 1 I have shown a tunable high-frequency oscillator 1 provided with a tank circuit 1$a$, including a varactor, which determines its operating frequency F. The oscillator has an output lead 4 from which a branch 4' extends to a pulse-rate modifier 5 provided with a control input 8, the latter being connected to a source 50 of control pulses recurring with a cadence $k < F$. Pulse-rate modifier 5 can be either of the subtractive type, as described hereinafter with reference to FIG. 2, or of the additive type, as more fully illustrated in FIG. 7.

A storage stage 9 is inserted between the modifier proper and its control input 8.

A generator 7 of constant reference frequency $f$ works into a phase comparator 3 which also receives, through a frequency divider 6 of step-down ratio $n : 1$, the output of modifier 5. Either the oscillator 1 or the modifier 5 includes a pulse shaper 10, shown separately in FIG. 2, which converts the original sinusoidal oscillation of frequency F into a train of equispaced short pulses referred to hereinafter as spikes; the spacing of these spikes is sufficient to let them retain their identity even if the oscillator operates at the upper limit of its range and if, in the case of an additive modifier, additional spikes are interleaved with those originally generated. Generator 7 is also assumed to include such a pulse shaper.

The subtraction or addition of one spike per control pulse in modifier 5 gives rise to an irregular sequence of spikes, of mean repetition frequency F', in the input of frequency divider 6; the output of the divider, therefore, is a similar pulse sequence of mean frequency $F'/n$. Phase comparator 3 receives both frequencies $f$ and $F'/n$ and, in the event of a disparity, generates an output voltage which readjusts the varactor of tank circuit 1$a$ to change the oscillator frequency F until $f = F'/n$. Reference in this connection may be made to my prior U.S. Pat. No. 3,453,542 and to commonly assigned U.S. Pat. No. 3,681,706 in the name of Peter Harzer.

In principle, and as well known per se, the phase comparator 3 comprises a sawtooth-wave generator whose cycle is started by a pulse on one of its two inputs and stepped by a pulse on its other input, these two pulses being derived from divider 6 and from generator 7. The charging condenser of the sawtooth-wave generator is periodically discharged, upon the termination of each sawtooth, into a storage capacitor forming part of an integrating circuit of sufficiently large time constant to maintain a substantially steady control voltage in the input of tank circuit 1$a$. For explanatory purposes, it may be assumed that the end of a sawtooth is determined by an output pulse of divider 6 so that the voltage of the charging capacitor is temporarily increased by the suppression of a spike in modifier 5 (here considered as of the subtractive type) which effectively lengthens the operating cycle of the divider; this increased capacitor charge raises the oscillator frequency F with consequent restabilization of the sawtooth peaks at a new level. Obviously, an additive modifier 5 would cause a lowering of the sawtooth peaks in the presence of control pulses on terminal 8.

Figure 2:
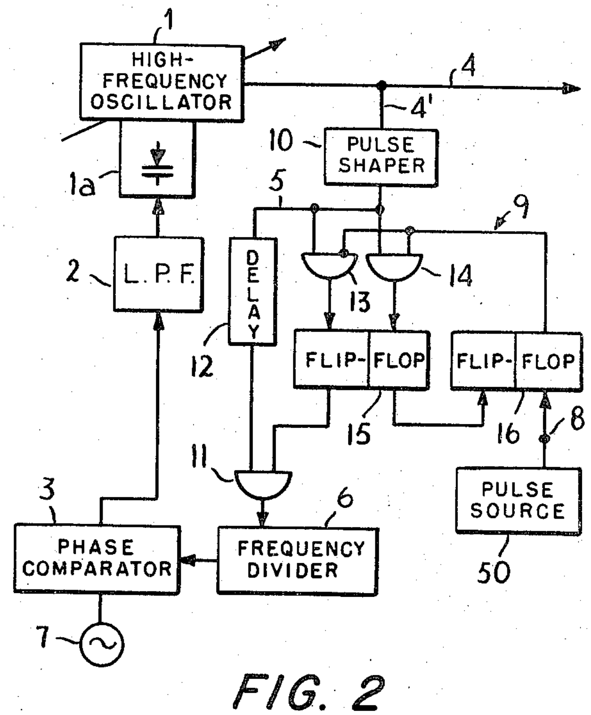
FIG. 2 is a more detailed block diagram of the system of FIG. 1 including additional features.

In FIG. 2, which depicts the same elements as FIG. 1, a low-pass filter 2 has been inserted between phase comparator 3 and tank circuit 1$a$ to help smooth the comparator output in the presence of fluctuating phase relationships as explained above. This filter may be an integrating network of the RC type including the aforementioned storage capacitor.

FIG. 2 further includes details of the pulse-rate modifier 5, operating here as a subtractor, and of its storage stage 9. The latter comprises a pair of flip-flops 15 and 16, flip-flop 16 having its setting input connected to control terminal 8 and having its set output connected in parallel to an inverting input of an AND gate 13 and to a noninverting input of an AND gate 14; the two AND gates have other (noninverting) inputs connected to lead 4' via pulse shaper 10. This pulse shaper also works, through a delay circuit 12, into one input of a further AND gate 11 whose other input is tied to the reset output of flip-flop 15. The set output of this flip-flop is connected to the resetting input of flip-flop 16; AND gates 13 and 14, when conducting, energize the resetting and setting inputs of flip-flop 15, respectively.

In the absence of a control pulse on terminal 8, flip-flop 16 is reset so that AND gate 13 passes the spikes arriving from pulse shaper 10 and causes the resetting of flip-flop 15 if it had been previously set. In that reset state the flip-flop 15 opens the AND gate 11 to the spikes passing with a slight delay through circuit 12 into divider 6. The divider, therefore, transmits a pulse to phase comparator 3 for every cycle of frequency F; this stabilizes the oscillator 1 at its minimum frequency $F_{min} = nf$.

The appearance of a control pulse on terminal 8 sets the flip-flop 16 and blocks the AND gate 13 while unblocking the AND gate 14 so that the next spike from pulse shaper 10 also sets the flip-flop 15; this action immediately resets the flip-flop 16, which therefore does not remain set for more than one oscillator cycle, and closes the AND gate 11 before it can pass the delayed replica of the spike which cleared the gate 14. With the resetting of flip-flop 16, gates 13 and 14 are restored to their normal condition so that the following spike resets the flip-flop 15 in time to give it passage, after its delay in circuit 12, through gate 11. Thus, modifier 5 reduces the number of spikes in the input of divider 6 from F to F–$k$, with the result that oscillator 1 is readjusted to stabilize at a new operating frequency $F = nf + k$.

If, for example, frequency divider 6 has a step-down ratio of 20 : 1 ($n = 20$), and if $f = 100$ kHz, an oscillator frequency F = 2.5 MHz can be established by a train of control pulses having a cadence $k = 500$ kHz. The same result can be obtained with $n = 24$ and $k = 100$ kHz.

Figure 3:
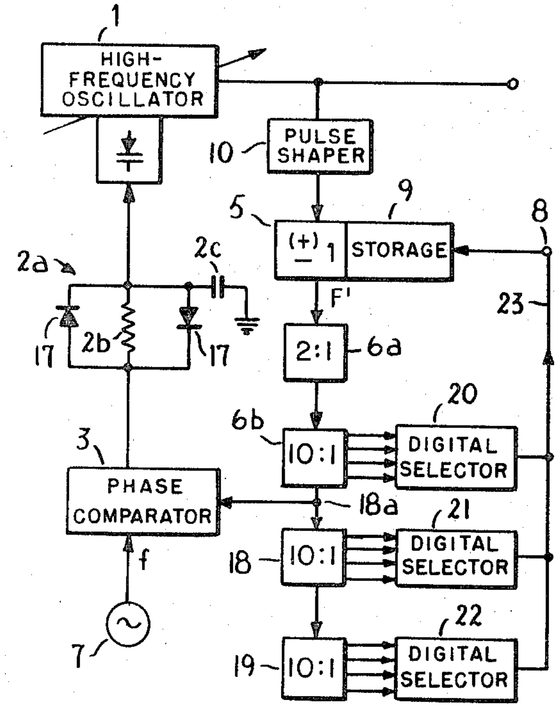
FIGS. 3, 4 and 5 are similar block diagrams of different embodiments of my invention.

The system of FIG. 3 differs from that of FIG. 2, on the one hand, by the use of a modified low-pass filter 2*a* and, on the other hand, by the substitution of a set of digital selectors 20 – 22 for the independent pulse source 50. Frequency divider 6, with a step-down ratio of 20 : 1, has been shown split into a binary stage 6*a* and a decadic stage 6*b*, the latter working not only into comparator 3 but also into two further cascaded decadic stages 18 and 19. Each decadic stage 6*b*, 18 and 19 has four output leads (cf. FIG. 8) terminating at an associated selector, i.e., selector 20 in the case of stage 6*b*, selector 21 in the case of stage 18 and selector 22 in the case of stage 19. The three selectors work in parallel (e.g. through nonillustrated OR gates) into a lead 23 extending to control terminal 8 of unit 5, 9.

Each of the selectors 20 – 22 is adjustable to transmit a desired number of control pulses, ranging from 0 through 9, to lead 23 during every operating cycle of the associated step-down stage. The pulses emitted by selector 20 recur, as a group, at a rate equal to reference frequency $f$ during steady-stage operation) and individually at a mean rate harmonically related to that reference frequency; the group rates of selectors 21 and 22 are subharmonically related to frequency $f$ whereas their mean pulse rates may or may not be submultiples of this frequency.

Filter network 2*a* is seen to comprise a series resistor 2*b*, shunted by two antiparallel diodes 17, as well as a shunt condenser 2*c*. Thus, this network has a time constant which is relatively large for small voltage differences developed across the resistor 2*b* (i.e., between the charging condenser of comparator 3 and the storage capacitor 2*c* at the instant of charge transfer) and is relatively small for large voltage differences.

Figure 4:
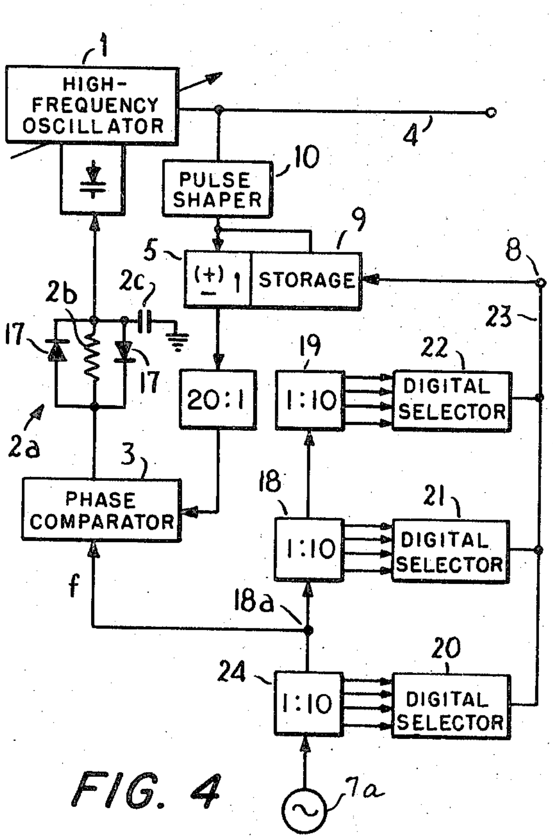

The embodiment of FIG. 4 is generally similar to that of FIG. 3, except that step-down stages 18 and 19 are here driven from a divider stage 24 in parallel with the phase comparator 3; stage 24, connected in the output of a constant-frequency oscillator 7*a* operating at frequency 10*f*, thus forms part of the reference-frequency generator 7. Digital selector 20 is now connected to the output lead of decadic stage 24 and, as before, supplies groups of control pulses (from 0 – 9 per cycle) at a recurrence rate equal to frequency $f$; the group rates of the output of selectors 21 and 22 are again subharmonically related to that frequency.

In FIGS. 3 and 4 the cascading of the step-down stages associated with selectors 20 – 22 may result in the occasional coincidence of their respective output pulses if the transit time of these stages is less than the pulse width. In order to prevent this undesirable loss of control pulses, the times of occurrence of these pulses in the several stage outputs may be relatively staggered by the interposition of nonillustrated delay circuits, or by interval delays as described hereinafter with reference to FIG. 8. It is also possible to drive the stages 6*b* (or 24), 18 and 19 by staggered input pulses as disclosed in commonly owned U.S. Pat. application Ser. No. 388,887, concurrently filed by Peter Harzer and me.

Figure 5:
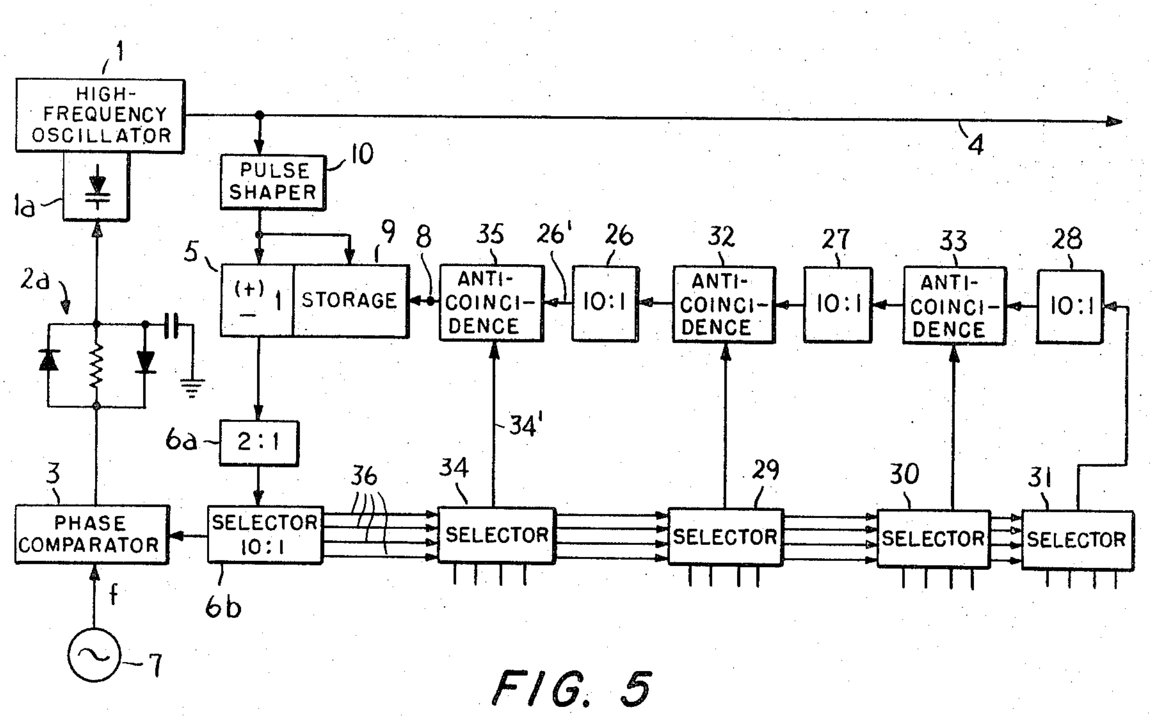

The system of FIG. 5 corresponds in part to that of FIG. 3 but comprises a plurality of selectors 29, 30, 31 and 34 all connected in parallel to the set of four output leads 36 of divider stage 6*b*. A separate chain of cascaded decadic step-down stages 26, 27 and 28 are individually controlled by selectors 29, 30 and 31, respectively, with interposition of anticoincidence circuits 32 and 33 in the case of the two first-mentioned selectors. Selector 34 works directly into terminal 8 of unit 5, 9, in parallel with the output of stage 26, by way of a further anticoincidence circuit 35.

Figure 10:
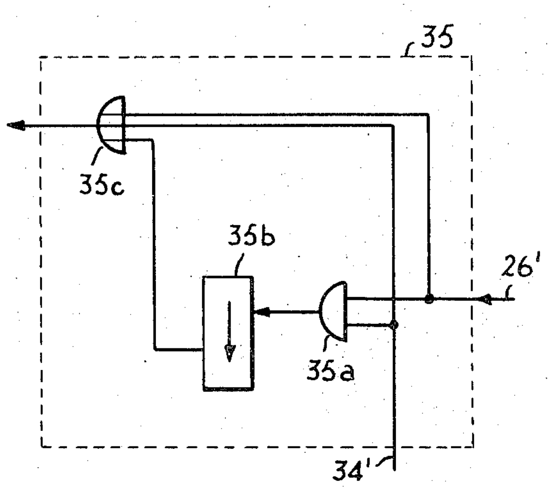
FIG. 10 is a circuit diagram of an anticoincidence network included in the systems of FIGS. 5 – 7.

The purpose of the anticoincidence circuits 32, 33 and 35 is to prevent the merger of two pulses, one from the associated selector and one from the preceding step-down stage, with consequent reduction in the effective value of rate $k$ compared with the decadic selector 7. Such an anticoincidence circuit, as specifically illustrated for circuit 35 in FIG. 10, may comprise an AND gate 35*a* with inputs connected to output leads 34′, 26′ of the associated selector and step-down stage; a monostable multivibrator or monoflop 35*b*, triggerable by the output of gate 35*a*; and an OR gate 35*c* having two inputs respectively connected to leads 26′ and 34′ as well as a third input receiving a pulse from monoflop 35*b* upon its return to normal. Thus, a pulse on lead 26′ or 34′ will simply pass the OR gate 35*c*; if two such pulses coincide, however, AND gate 35*a* conducts and trips the monoflop 35*b* which then generates a delayed second pulse in the output of the OR gate. Naturally, the off-normal period of the monoflop must be less than the minimum spacing of two consecutive selector pulses.

Figure 5A:
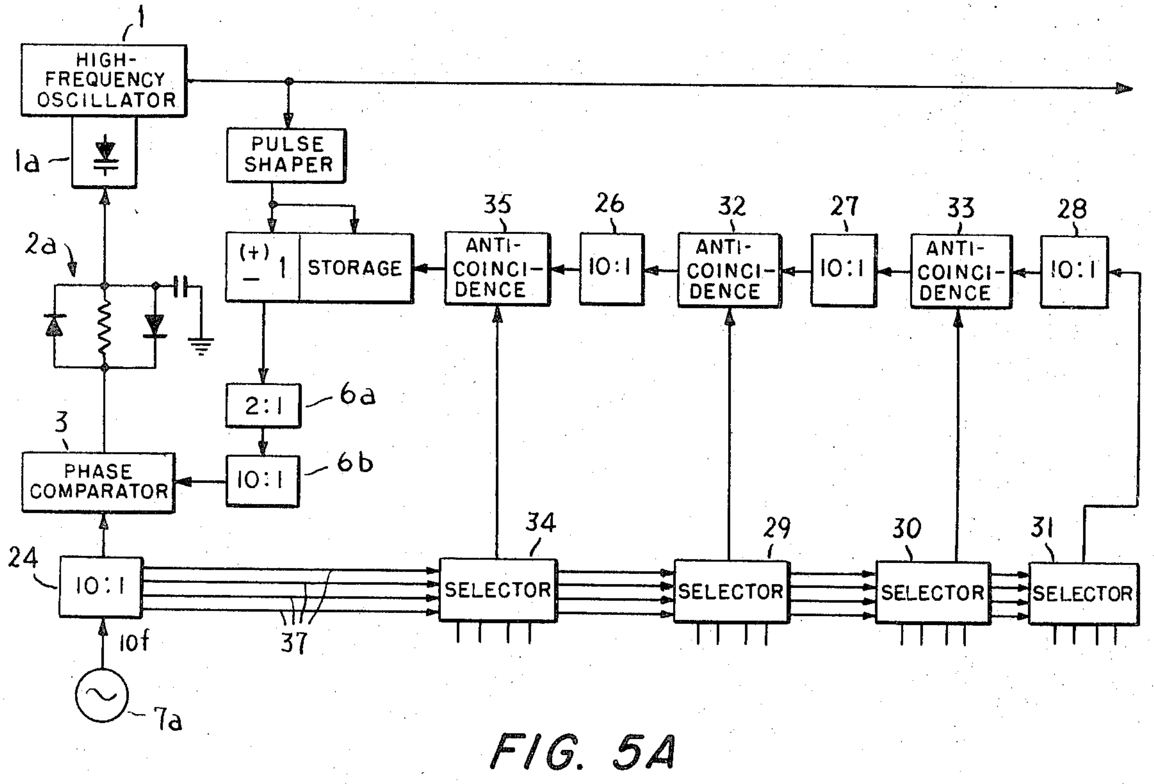
FIG. 5A is a block diagram showing a modification of the system of FIG. 5.

As shown in FIG. 5A, in which the reference generator 7 again comprises an oscillator 7*a* of frequency 10*f* and a decadic divider stage 24, the selectors 29, 30, 32 and 34 may be connected to output leads 37 of stage 24 rather than to the corresponding leads 36 emanating from divider stage 6*b*. The operation of the system of FIG. 5A is otherwise identical with that of the embodiment shown in FIG. 5.

Figure 9:
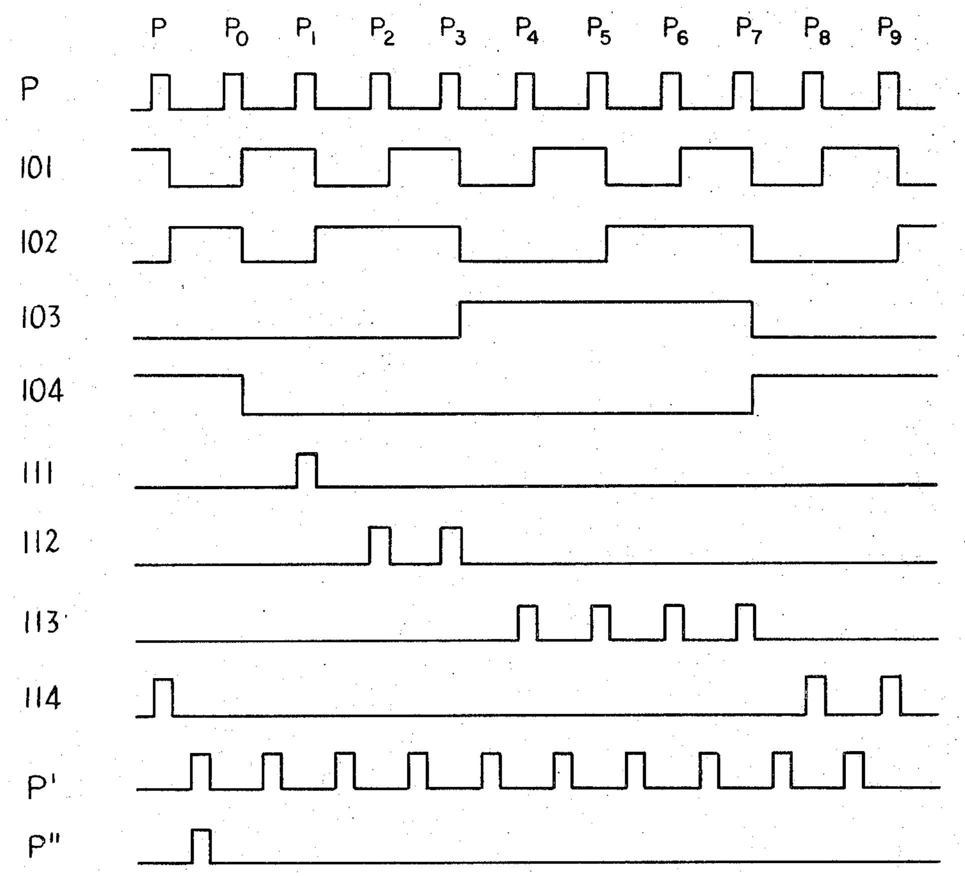
FIG. 9 is a set of graphs relating to the operation of the divider stage of FIG. 8.
Figure 8:
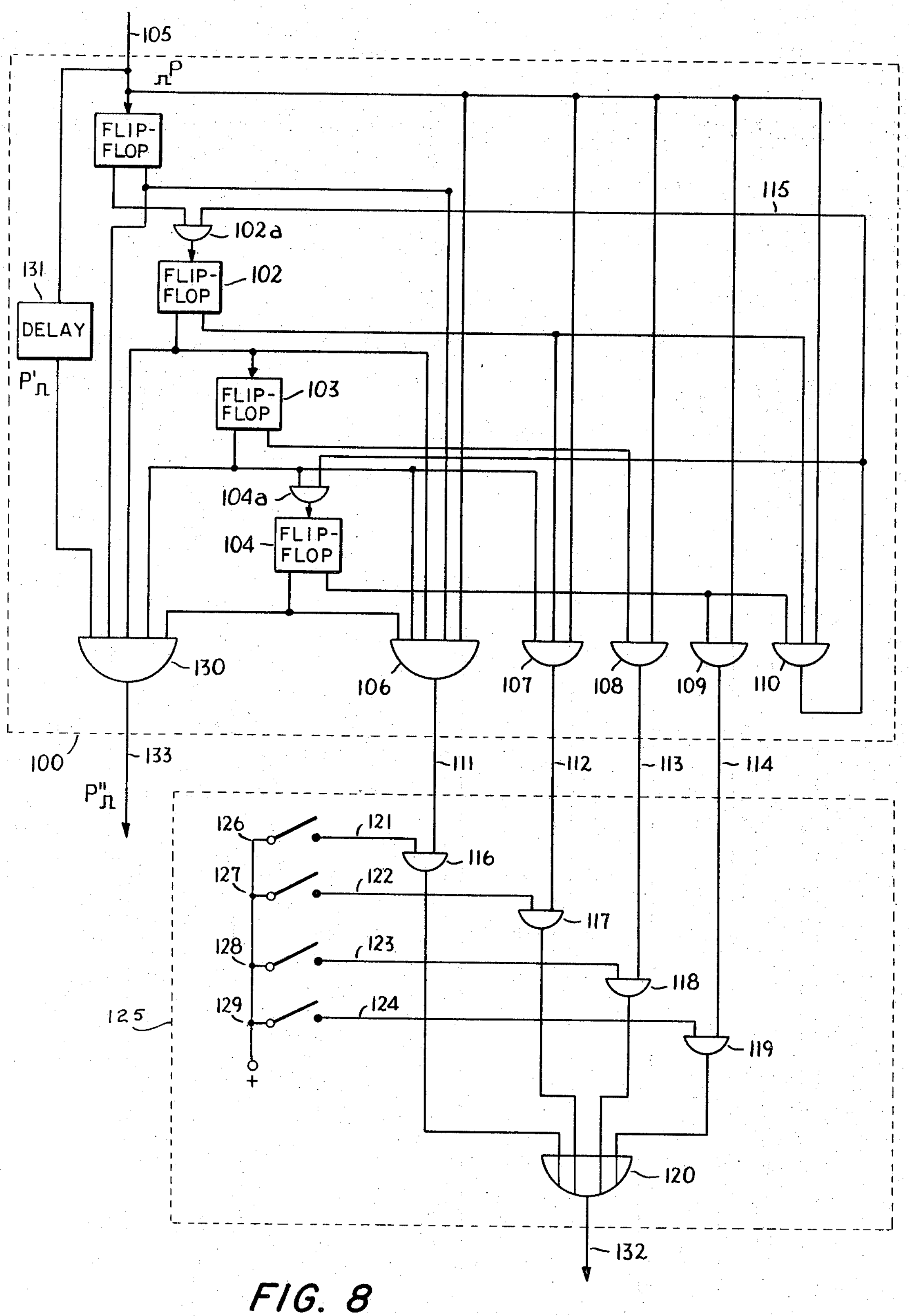
FIG. 8 is a circuit diagram of a decadic divider stage used in any of the preceding systems.

Let us consider now, with reference to FIG. 8, a typical decadic divider stage 100 representative of any of stages 6*b*, 18, 19, 24, 26, 27 and 28. The stage comprises four cascaded flip-flops 101, 102, 103 and 104 each with a central switching input whose energization alternately sets and resets the flip-flops as is well known per se. Pulses P, arriving over a lead 105, alternately set and reset the first flip-flop 101 on the trailing edges of these pulses; this has been illustrated in FIG. 9 which also shows that the resetting of any lower-ranking flip-flop 101, 102 or 103 sets the immediately following flip-flop 102, 103 or 104. The pulses P are also fed in parallel to five AND gates 106, 107, 108, 109, 110 having inputs connected in various combinations to the set and reset outputs of the several flip-flops so that gate 106 passes pulse $P_1$ to its output lead 111, gate 107 passes pulses $P_2$ and $P_3$ to its output lead 112, gate 108 passes pulses $P_4$, $P_5$, $P_6$ and $P_7$ to its output lead 113 and gate 109 passes pulses $P_8$ and $P_9$ to its output lead 114. After the passage of pulse $P_9$, flip-flops 102 and 104 are set and open the gate 110 to the passage of the immediately following pulse $P_o$ which, via an output lead 115 and a pair of OR gates 102*a* and 104*a*, resets the flip-flops 102 and 104 at the same time that flip-flop 101 is being set.

Output leads 111, 112, 113, 114 terminate, within a selector 125, at respective AND gates 116, 117, 118 and 119 which in turn work into a common OR gate 120. Four conductors 121, 122, 123, 124 are tied to other inputs of AND gates 116 – 119 and are selectively energizable by manually operable switch contacts 126, 127, 128 and 129. Selector 125 is, of course, representative of any of the selectors 20 – 22, 29 – 31 and 34 shown in FIGS. 3 – 6.

The pulses appearing at the end of each cycle on output lead 115 of AND gate 110 could be used to drive the next-following divider stage in a chain of such stages. However, in order to prevent the coincidence of output pulses from the selectors associated with several cascaded divider stages as illustrated in FIGS. 3 and 4, I may provide a further AND gate 130 to which pulses P', staggered with reference to driving pulses P, are delivered via delay circuit 131 connected to lead 105. Gate 130 has inputs connected to the set output of flip-flop 101 and to the reset outputs of flip-flops 102 – 104 so as to conduct only in the interval between pulses $P_o$ and $P_1$.

Depending on the positions of switches 126 – 129, the number of pulses appearing on an output lead 132 of selector 125 (energized by OR gate 120) between successive pulses P'' on an output lead 133 of divider stage 100 (energized by AND gate 130) will range from 0 through 9.

Figure 6:
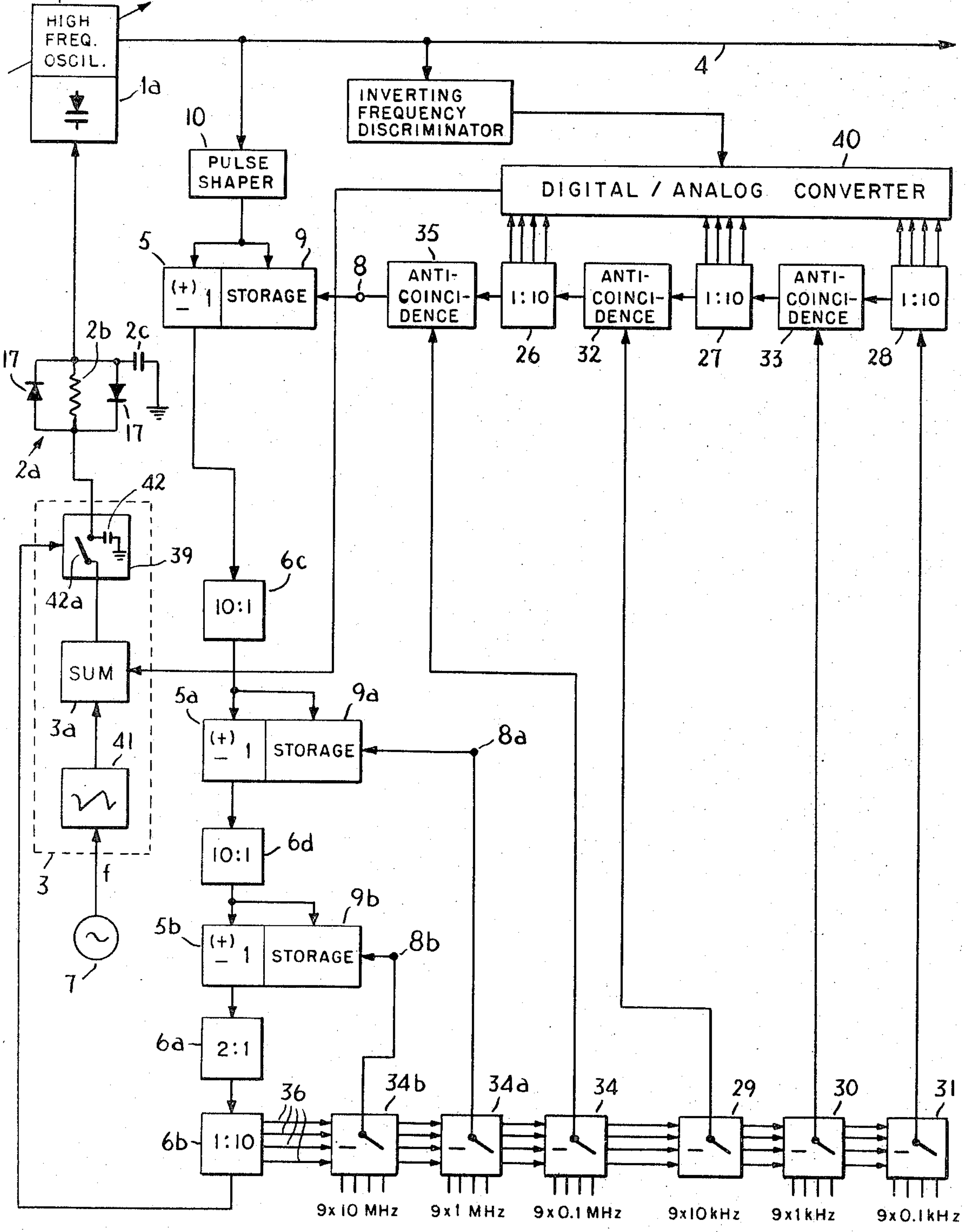
FIG. 6 is a block diagram of a further embodiment.

In FIG. 6 the system of FIG. 5 has been supplemented by additional decadic divider stages 6*c*, 6*d*, as well as by further subtractive pulse-rate modifiers 5*a* and 5*b* respectively inserted between stages 6*c*, 6*d* and between stages 6*d*, 6*a*, each of these modifiers being provided with an associated storage stage 9*a*, 9*b*, provided with a control terminal 8*a*, 8*b*. Two further selectors 34*a* and 34*b*, connected along with selectors 29 – 31 and 34 to the output leads 36 of divider stage 6*b*, work into terminals 8*a* and 8*b*, respectively.

In the systems of FIGS. 5 and 5A, with a reference frequency *f* of 100 kHz as heretofore assumed, the frequency increment of selector 31 (i.e., the change in oscillator frequency F resulting from a unit setting "1" of the selector) is 100 Hz so that this selector is effective over a range of adjustment of 0 – 900 Hz; the corresponding increments of selectors 30, 29 and 34 are 1 kHz, 10 kHz and 100 kHz, respectively. These increments also apply to the system of FIG. 6 wherein, however, the overall range of adjustment has been extended from 999.9 kHz to 99.999 MHz through the addition of selectors 34*a* and 34*b* with respective increments of 1 MHz and 10 MHx. With a basic oscillator frequency $F_o = 2$MHz, this extended range amounts to practically $F_o/2$.

FIG. 6 also shows details of the phase comparator 3 which includes a sawtooth-wave generator 41, a storage circuit 39 with a capacitor 42 and a charging switch 42*a*, and an interposed summing circuit 3*a*. The summing circuit receives on the one hand the sawtooth voltage of generator 41 and on the other hand a compensating voltage from a digital analog converter 40 which is connected to the subharmonic step-down stages 26 – 28. Converter 40 translates the instantaneous pulse counts of these stages, properly weighted in accordance with their decadic positions, into an output signal reflecting the setting of the associated selectors 29, 30 and 31 operating in the range of 0 through 99,9 kHz.

If any of the three lowest-ranking selectors 29 – 31 has been set to a digital value other than zero, pulses are fed to the corresponding step-down stage 26 – 28 and will eventually appear on control terminal 8 of modifier unit 5, 9. The resulting subharmonic pulse suppression on the output of the final divider stage 6*b* causes a phase shift, i.e., an increase in the peak voltage of sawtooth generator 41 whose rising flank is lengthened by the corresponding delay of the pulse which terminates the charging of a condenser within generator 41 and transfers its charge to capacitor 42 by a brief closure of switch 42*a*. This transfer, therefore, causes a sudden increase in the charge of capacitor 42 which is only gradually dissipated over the subsequent measuring period or periods in which no such subharmonic pulse suppression occurs. Thus, the charge of capacitor 42 has the shape of a sawtooth wave with sloping trailing edge.

On the other hand, the pulsing of any step-down stage 26, 27, 28 by the associated selector 29, 30, 31 progressively changes the count of such stage, and of the chain 26 – 28 as a whole, until the stage is cleared by the readout of a stepping pulse therefrom. This progressively increasing count produces in the output of converter 40 a sawtooth wave with sloping leading edge which is fed to the summing circuit 3*a* so as to compensate, substantially, the effect of the subharmonic pulse or pulse group with resulting leveling of the charge of capacitor 42. Residual ripples are again suppressed by the filter 2*a*.

As explained above, the relative significance of a unit setting of any selector 29 – 32 varies inversely with oscillator frequency F; thus, if more spikes are suppressed in the modifiers 9, 9*a*, 9*b*, under the control of the higher-ranking selectors 34, 34*a*, 34*b*, the effect of the suppression of additional spikes in response to the setting of selectors 29 – 31 becomes less pronounced and requires a flatter compensating voltage from converter 40. To this end I connect an inverting frequency discriminator 43 between output lead 4 and a control input of converter 40 in order to weight the analog output of the converter by a factor proportional to cycle length.

Figure 7:
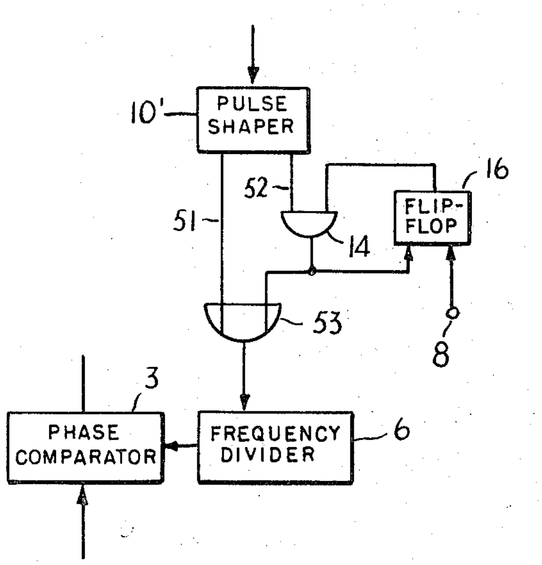
FIG. 7 is a circuit diagram of an additive pulse-rate modifier adapted to be used in any of the preceding embodiments.

Reference will now be made to FIG. 7 which shows a pulse-rate modifier designed to add rather than subtract a spike upon the appearance of a control pulse on its terminal 8. In this instance the pulse shaper 10 of FIG. 2 has been replaced by another pulse shaper 10' generating two spikes per oscillator cycle, the first (e.g. on a positive-going half-cycle) on a lead 51 and the second (e.g. on a negative-going half-cycle) on a lead 52. Control terminal 8 is again connected to the setting input of a flip-flop 16 whose set output is tied to one of the inputs of an AND gate 14 having its other input connected to lead 52. Lead 51 and the output of gate 14 terminate at an OR gate 53 working into the frequency divider 6. The resetting input of flip-flop 16 is tied to the output of ANG gate 14.

Normally, i.e., in the absence of a control pulse on terminal 8, flip-flop 16 is reset and gate 14 is blocked so that only the spikes on lead 51, occurring once per oscillator cycle, reach the frequency divider 6 via OR gate 53. The setting of flip-flop 16 by a control pulse renders the AND gate 14 conductive whereby the next spike on lead 52 clears that gate and also reaches the divider 6 through OR gate 53. The same spike immediately resets the flip-flop 16 to restore the normal condition.

Thus, as long as the cadence $k$ of the incoming control pulses does not exceed the oscillator frequency F, the mean frequency F' in the divider input ranges between the basic oscillator frequency $F_o$ and $2F_o$. In the limiting case $k = F$, the oscillator frequency F is equal to $F_o/2$.

I claim:

1. A frequency synthesizer comprising:

oscillator means generating a sequence of spikes of variable repetition frequency F;

a generator of reference frequency $f < F$;

a source of control pulses recurring with a cadence $k < F$;

a frequency divider of step-down ratio $n : 1$ connected to receive said sequence of spikes from said oscillator means;

a pulse-rate modifier inserted between said oscillator means and said frequency divider, said modifier having a control input connected to said source for varying the rate of occurrence of said spikes by a unit change of $m$ spikes per control pulse whereby said spikes are delivered to said frequency divider with a mean repetition frequency $F' = F \pm mk$; and phase-comparison means connected to receive said reference frequency $f$ from said generator and a mean output frequency $F'/n$ from said frequency divider, said oscillator means being provided with frequency-control means connected to an output of said phase-comparison means for stabilizing said mean output frequency $F'/n$ at a value equal to said reference frequency $f$.

2. A frequency synthesizer as defined in claim 1 wherein $m = 1$.

3. A frequency synthesizer as defined in claim 1 wherein said modifier comprises bistable pulse-storing means connected to be set by a pulse on said control input and to be reset by a spike from said oscillator means.

4. A frequency synthesizer as defined in claim 3 wherein said modifier further comprises coincidence means connected to said pulse-storing means and to the output of said oscillator eans for suppressing a spike arriving during an oscillator cycle in which a control pulse is received.

5. A frequency synthesizer as defined in claim 1, further comprising low-pass filter means inserted between said phase-comparison means and said frequency-control means.

6. A frequency synthesizer as defined in claim 5 wherein said low-pass filter means comprises an RC network with a capacitive shunt arm and a resistive series arm, said series arm including threshold means for reducing the time constant of said network in response to a predetermined minimum voltage difference thereacross.

7. A frequency synthesizer as defined in claim 1 wherein said phase-comparison means has input connections to a first branch including said frequency divider and to a second branch including said generator, at least one of said branches including a decadic step-down stage, said source comprising digital selector means connected to said step-down stage.

8. A frequency synthesizer as defined in claim 7 wherein said source comprises at least one additional decadic step-down stage in cascade with the first-mentioned step-down stage, said selector means comprising individual selectors connected to respective output leads of said step-down stages.

9. A frequency synthesizer as defined in claim 7 wherein said source comprises a chain of additional decadic step-down stages, said selector means including a plurality of individual selectors connected in parallel to output leads of the first-mentioned step-down stage for respectively controlling said additional step-down stages.

10. A frequency synthesizer as defined in claim 9, further comprising anti-coincidence circuits inserted in said chain for preventing merger between pulses from associated selectors and from preceding stages.

11. A frequency synthesizer as defined in claim 9 wherein at least the lowest-ranking stage in said chain generates stepping pulses recurring at a rate lower than said reference frequency, further comprising a digital-/analog converter connected to receive the count of said lowest-ranking stage and to derive therefrom an electrical quantity delivered to said phase-comparison means for compensating discontinuities in the output thereof fed to said frequency-control means.

12. A frequency synthesizer as defined in claim 11, further comprising frequency-discriminating means connected to said oscillator means for delivering to said converter a corrective electrical quantity of a magnitude inversely proportional to said repetition frequency F.

13. A frequency synthesizer as defined in claim 7 wherein said step-down stage forms part of said frequency divider.

14. A frequency synthesizer as defined in claim 7 wherein said step-down stage forms part of said generator.

15. A frequency synthesizer as defined in claim 7 wherein said frequency divider includes a plurality of cascaded decadic stages, further comprising at least one supplemental pulse-rate modifier inserted between two of said decadic stages, said selector means including a plurality of individual selectors connected in parallel to output leads of said step-down stage for respectively controlling said pulse-rate modifiers.

* * * * *